(12) United States Patent
Feng (10) Patent No.: US 12,302,518 B2
(45) Date of Patent: May 13, 2025

(54) ELECTRONIC DEVICE

(71) Applicant: VIVO MOBILE COMMUNICATION CO., LTD., Dongguan (CN)

(72) Inventor: Xiang Feng, Dongguan (CN)

(73) Assignee: VIVO MOBILE COMMUNICATION CO., LTD., Dongguan (CN)

( * ) Notice: Subject to any disclaimer, the term of this patent is extended or adjusted under 35 U.S.C. 154(b) by 195 days.

(21) Appl. No.: 18/082,571

(22) Filed: Dec. 15, 2022

(65) Prior Publication Data

US 2023/0119510 A1 Apr. 20, 2023

Related U.S. Application Data

(63) Continuation of application No. PCT/CN2021/100046, filed on Jun. 15, 2021.

(30) Foreign Application Priority Data

Jun. 18, 2020 (CN) .......................... 202010560169.8

(51) Int. Cl.
*H05K 5/02* (2006.01)
*H05K 5/00* (2006.01)

(52) U.S. Cl.
CPC ......... *H05K 5/0247* (2013.01); *H05K 5/0017* (2013.01)

(58) Field of Classification Search
CPC ... H05K 5/0247; H05K 5/0017; H05K 5/0217
USPC ........ 361/752, 728, 796, 800, 807, 809, 810
See application file for complete search history.

(56) References Cited

U.S. PATENT DOCUMENTS

| 2006/0135228 A1 | 6/2006 | Kato |
| 2015/0103195 A1 | 4/2015 | Kwon et al. |
| 2020/0213491 A1* | 7/2020 | Huang ............... H04N 23/60 |

FOREIGN PATENT DOCUMENTS

| CN | 108234700 A | 6/2018 |
| CN | 108683760 A | 10/2018 |
| CN | 208631870 U | 3/2019 |
| CN | 109981948 A * | 7/2019 ............. H04N 5/225 |
| CN | 110149424 A | 8/2019 |

(Continued)

OTHER PUBLICATIONS

Extended European Search Report issued in related European Application No. 21825807.7, mailed Nov. 8, 2023, 7 pages.

(Continued)

*Primary Examiner* — Hung S. Bui
(74) *Attorney, Agent, or Firm* — IPX PLLC (57) ABSTRACT

An electronic device includes a housing provided with an accommodating space and a first opening communicated with the accommodating space; a functional unit movably disposed in the accommodating space; a drive device disposed in the housing, the drive device is connected with the functional unit, and the drive device drives the functional unit to retract into the accommodating space through the first opening, or at least partially extend out of the accommodating space; and a rolling body disposed on a side wall of the accommodating space, and during movement of the functional unit relative to the side wall of the accommodating space, the rolling body is in rotational contact with the functional unit, and an extending direction of the side wall is parallel to a moving direction of the functional unit.

13 Claims, 6 Drawing Sheets

(56) References Cited

FOREIGN PATENT DOCUMENTS

| CN | 110784572 A | 2/2020 |
| CN | 110839097 A | 2/2020 |
| CN | 111043504 A | 4/2020 |
| CN | 210578857 U | 5/2020 |
| CN | 111712070 A | 9/2020 |
| WO | 2019199350 A1 | 10/2019 |

OTHER PUBLICATIONS

International Search Report issued in corresponding International Application No. PCT/CN2021/100046, mailed Sep. 1, 2021, 5 pages.

First Office Action issued in related Chinese Application No. 202010560169.8, mailed Feb. 20, 2021, 6 pages.

Second Office Action issued in related Chinese Application No. 202010560169.8, mailed Sep. 6, 2021, 7 pages.

\* cited by examiner

ELECTRONIC DEVICE

CROSS-REFERENCE TO RELATED APPLICATIONS

This application is a continuation of International Application No. PCT/CN2021/100046, filed on Jun. 15, 2021, which claims priority to Chinese Patent Application No. 202010560169.8, filed on Jun. 18, 2020. The entire contents of each of the above-identified applications are expressly incorporated herein by reference.

TECHNICAL FIELD

This application relates to the technical field of communications devices, and in particular to an electronic device.

BACKGROUND

With the progress of technologies and the development of electronic devices, users have greater demand for full-screen display electronic devices. Therefore, a full screen electronic device has gradually become a development trend.

Using a camera unit as an example, the camera unit can move relative to a housing, and the housing is provided with a drive device. The drive device is fixedly connected to one side of the camera unit, so that the drive device can drive the camera unit into and out of the housing. The camera unit does not occupy a display area of the electronic device, thereby increasing a proportion of the screen of the electronic device. This is conducive to the development of full-screen electronic devices.

However, when the camera unit goes in and out of the housing, the drive device is located at one side of the camera, and both sides of the camera is subject to friction, resulting in uneven force when the camera extends or retracts and a problem of slanting.

Certainly, the foregoing problem is not limited to the camera unit, but also other telescopic functional units of the electronic device.

SUMMARY

This application discloses an electronic device.

An electronic device, includes a housing, where the housing is provided with an accommodating space and a first opening communicated with the accommodating space; a functional unit, where the functional unit is movably disposed in the accommodating space; a drive device, where the drive device is disposed in the housing, the drive device is connected with the functional unit, and the drive device can drive the functional unit to retract into the accommodating space through the first opening, or at least partially extend out of the accommodating space; and a rolling body, where the rolling body is disposed on a side wall of the accommodating space, and during movement of the functional unit relative to the side wall of the accommodating space, the rolling body is in rotational contact with the functional unit, and an extending direction of the side wall is parallel to a moving direction of the functional unit.

BRIEF DESCRIPTION OF DRAWINGS

The following describes the accompanying drawings for describing the embodiments or the background. Apparently, a person of ordinary skill in the art may still derive other drawings from these accompanying drawings without creative efforts.

Reference numerals in the accompanying drawings are as follows:

100: housing; 110: accommodating space; 111: first opening; 112: installation space; 113: second opening; 114: limiting protrusion; 115: first sub side wall; 116: second sub side wall;

200: functional unit; 210: sliding groove; 220: unit body; 230: unit bracket;

300: rolling body;

400: elastic piece;

500: guide piece; 510: rod portion; 520: limiting cap;

610: drive portion; and 620: lead screw.

DETAILED DESCRIPTION

The following describes this application with reference to the specific embodiments of this application and the corresponding accompanying drawings. Apparently, the described embodiments are merely some but not all of the embodiments of this application. All other embodiments obtained by a person of ordinary skill in the art based on the embodiments of this application without creative efforts shall fall within the protection scope of this application.

Figure 1:
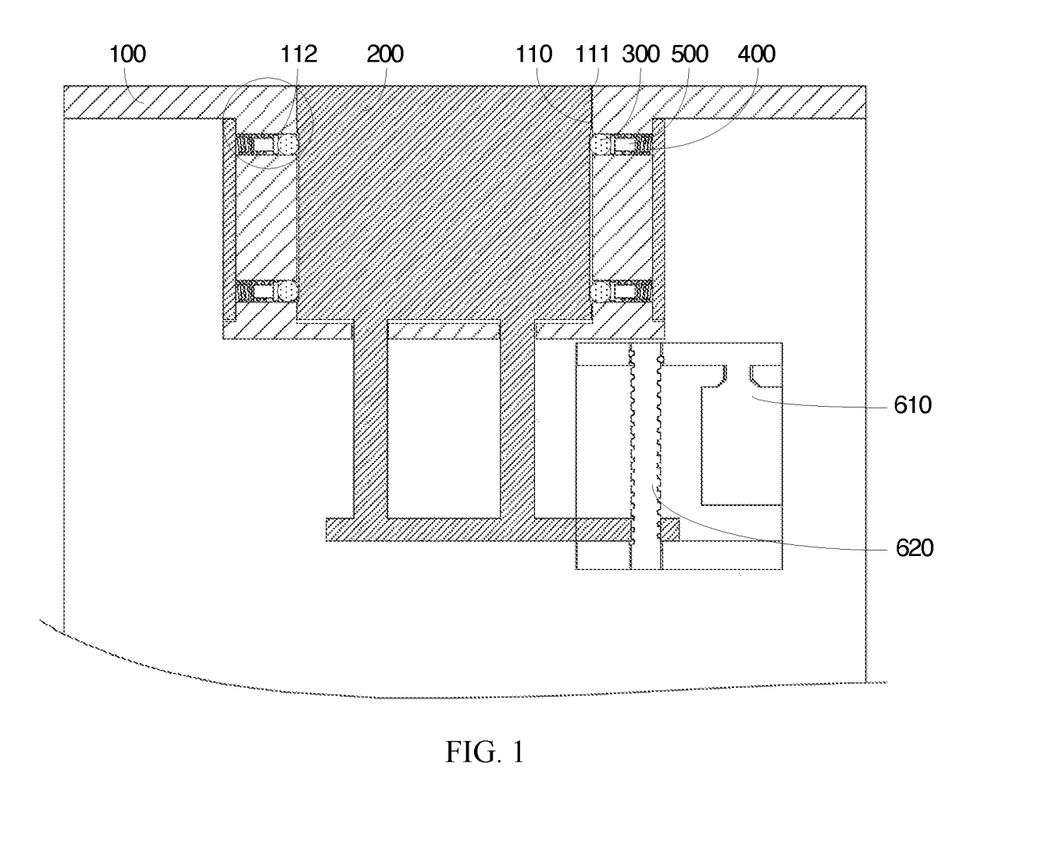
FIG. 1 is a partial cross-sectional view of an electronic device disclosed in an embodiment of this application.
Figure 2:
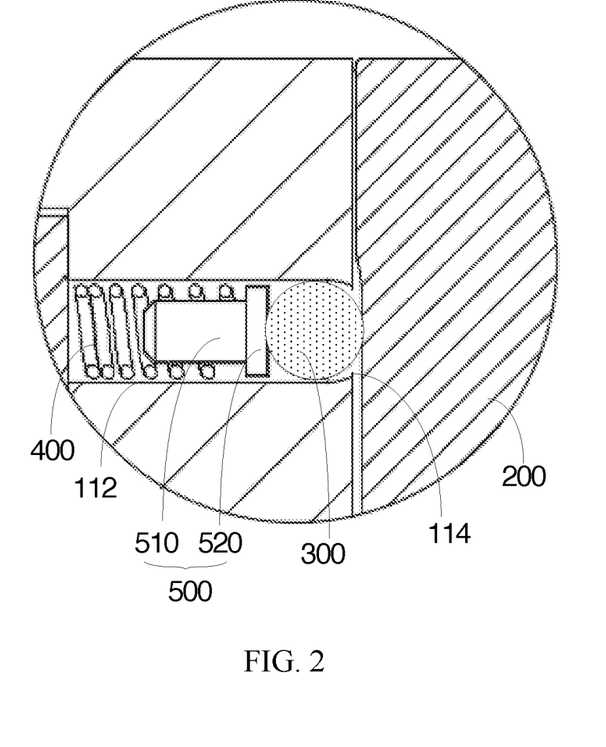
FIG. 2 is a locally enlarged view of FIG. 1.
Figure 3:
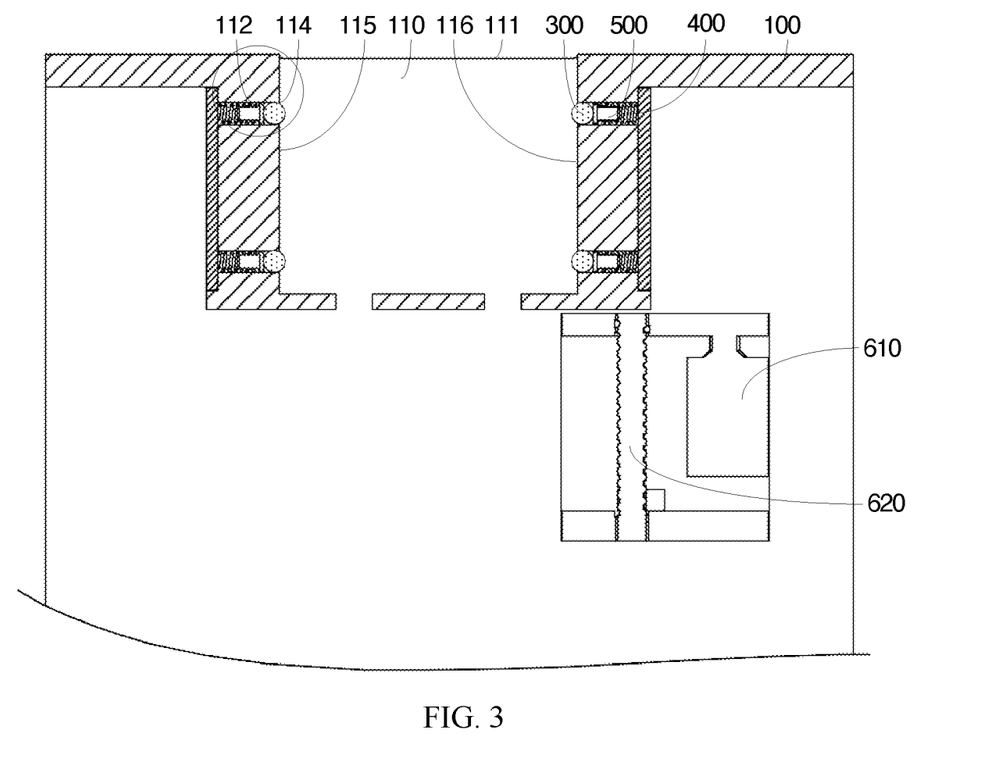
FIG. 3 is a cross-sectional view of a partial structure of an electronic device disclosed in an embodiment of this application.
Figure 4:
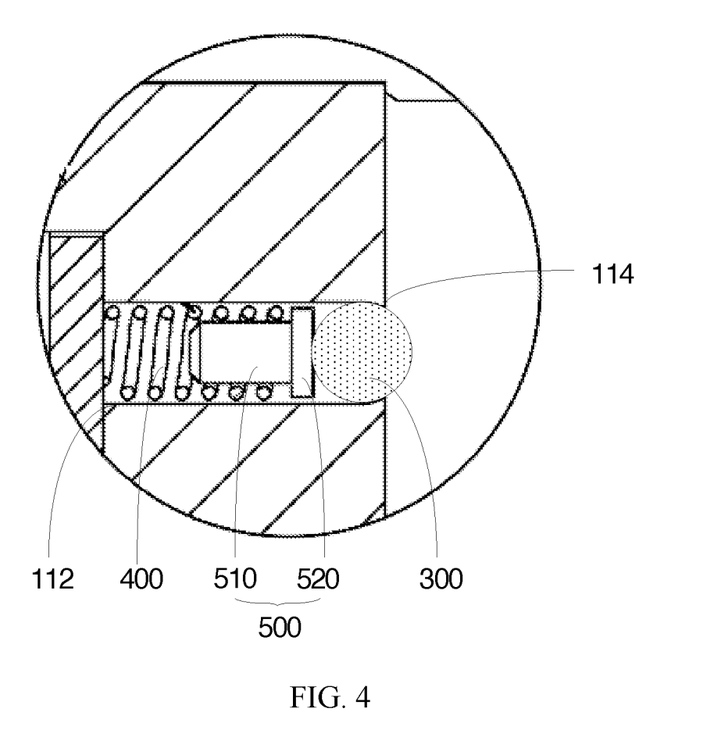
FIG. 4 is a locally enlarged view of FIG. 3.
Figure 5:
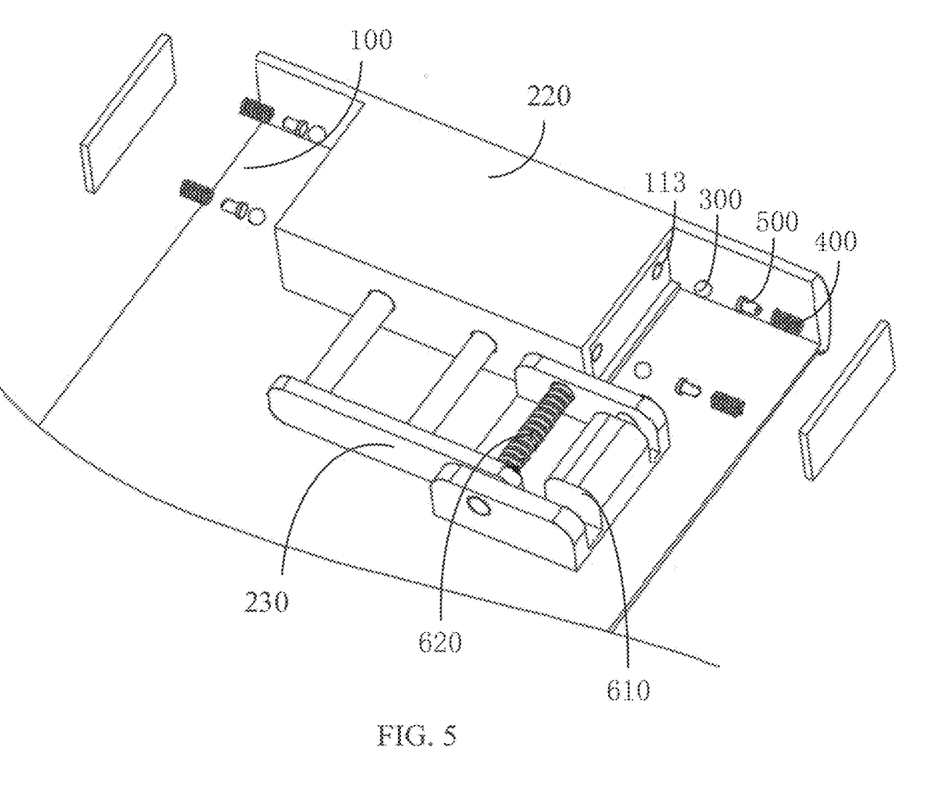
FIG. 5 is an exploded view of an electronic device disclosed in an embodiment of this application embodiment.
Figure 6:
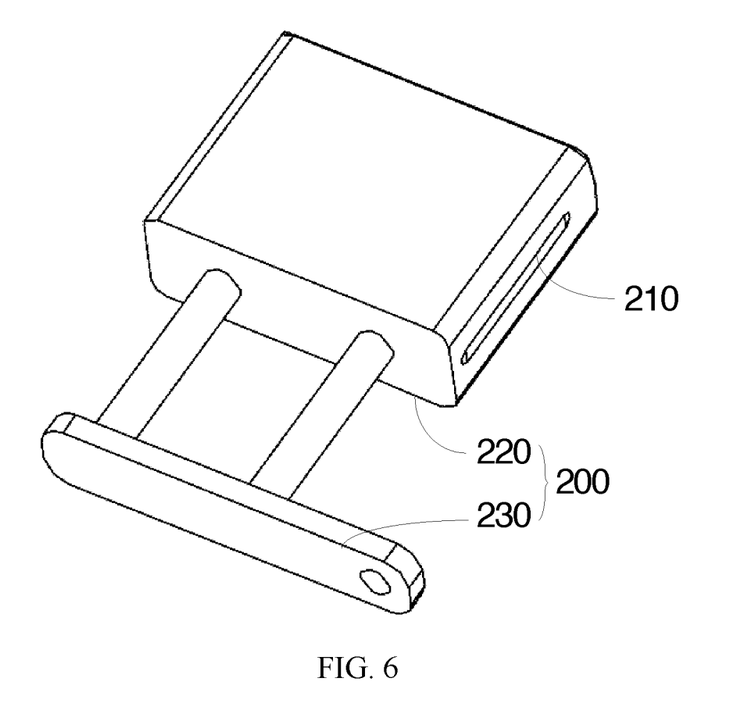
FIG. 6 is a schematic structural diagram of a functional unit disclosed in an embodiment of this application.

As shown in FIG. 1 to FIG. 6, an embodiment of this application discloses an electronic device. The disclosed electronic device includes a housing 100, a functional unit 200, a drive device and a rolling body 300.

The housing 100 is a peripheral component of the electronic device. The housing 100 can provide an installation position for other components of the electronic device. In some embodiments of this application, the housing 100 is provided with an accommodating space 110. The accommodating space 110 can provide a mounting position for the functional unit 200. The housing 100 is provided with a first opening 111 communicated with the accommodating space 110. The functional unit 200 can retract into the accommodating space 110 through the first opening 111, thereby hiding the functional unit 200. The functional unit 200 can further extend at least partially out of the accommodating space 110 through the first opening 111, so that the functional unit 200 can play better corresponding functions.

In some implementations, the accommodating space 110 may be a space enclosed by an outer surface of the housing 100. For example, the outer surface of the housing 100 may enclose a concave. The concave may be the accommodating space 110. In this case, the accommodating space 110 is a relatively independent space, thereby facilitating the installation of the functional unit 200. The accommodating space 110 may also be a part of an inner cavity of the housing 100, which is not limited in this embodiment of this application.

In some implementations, the first opening 111 may also be disposed in a middle frame of the housing 100. The first opening 111 may also be disposed in another position of the housing 100, which is not limited in this embodiment of this application.

The functional unit 200 is movably disposed in the accommodating space 110, so that the functional unit 200 can retract into the accommodating space 110 through the first opening 111 or at least partially extend out of the accommodating space 110. The functional unit 200 may include at least one of a camera assembly, a fit-in light unit, a fingerprint recognition unit, a USB interface, and a telephone receiver. The functional unit 200 may further include other types of functional components. The specific types of the functional unit 200 are not limited in this embodiment of this application.

The drive device is disposed in the housing 100. The drive device is connected to the functional unit 200. The drive device can drive the functional unit 200 to retract into the accommodating space 110 through the first opening 111 to hide the functional unit 200, or the drive device can drive the functional unit 200 to at least partially extend out of the accommodating space 110 through the first opening 111 to enable the functional unit 200 to work outside the accommodating space 110, so that the function unit 200 can play better functions. The drive device may be a hydraulic telescopic rod device, a gear and rack device, a lead screw drive device, and the like, which is not limited in this embodiment of this application.

The rolling body 300 is disposed on a side wall of the accommodating space 110. During a movement of the functional unit 200 relative to the side wall of the accommodating space 110, the rolling body 300 is in rotational contact with the functional unit 200. An extending direction of the side wall of the accommodating space 110 is parallel to a moving direction of the functional unit 200. In this case, because the rolling body 300 is in rotational contact with the functional unit 200, a telescopic effect of the functional unit 200 can be improved to prevent the functional unit 200 from being stuck in the accommodating space 110.

It can be learned from the foregoing context that in the electronic device disclosed in this embodiment of this application, the rolling body 300 is disposed on the side wall of the accommodating space 110, so that the functional unit 200 can move more easily. Compared with current sliding fit between the functional unit 200 and the side wall of the accommodating space 110, in this embodiment of this application, because the functional unit 200 is in rotational contact with the rolling body 300, a contact surface between the functional unit 200 and the rolling body 300 is smaller, and a rotating friction force is much smaller than a sliding friction force, so that the friction force on the functional unit 200 can be reduced. This can improve movement stability of the functional unit 200 to prevent the functional unit 200 from being stuck in the accommodating space 110 during the movement, and also alleviate abrasion of the functional unit 200.

In some implementations, the rolling body 300 may be a rolling ball. Compared with the rolling body 300 of other shapes (for example, a roller), the rolling ball can roll in more directions, so that the functional unit 200 moves better. In addition, a contact area between the rolling ball and the functional unit 200 is smaller, so that friction between the functional unit 200 and the rolling body 300 is smaller, which is more conducive to the movement of the functional unit 200.

The electronic device disclosed in this embodiment of this application may further include an elastic piece 400, a first end of the elastic piece 400 may be connected to the side wall of the accommodating space 110, and a second end of the elastic piece 400 may be connected to the rolling body 300. In this case, the elastic piece 400 can apply an elastic force to the functional unit 200, and a direction of the elastic force can intersect the moving direction of the functional unit 200. Therefore, during the movement of the functional unit 200, when the functional unit 200 slants in a first direction, the elastic piece 400 can generate the elastic force on the functional unit 200, and the direction of the elastic force may be opposite the first direction, so that the functional unit 200 can be pushed back to its original position, and the functional unit 200 can move more stably towards the first opening 111.

It can be learned from the foregoing context that in the electronic device disclosed in this embodiment of this application, the elastic piece 400 is disposed at an installation position of the functional unit 200 (that is, the side wall of the accommodating space 110), so that the functional unit 200 is always subjected to the elastic force generated by the elastic piece 400 during the expanding and retracting process, and the direction of the elastic force is opposite the direction of the functional unit 200, so that the functional unit 200 can move more stably towards the first opening 111. Therefore, the friction between the functional unit 200 and the side wall of the accommodating space 110 is further reduced to mitigate the damage to the functional unit 200. In addition, this can also prevent the functional unit 200 from being stuck during movement.

Further, in this embodiment of this application, to prevent the elastic piece 400 from affecting the expanding and retracting of the functional unit 200, in some implementations, the side wall of the accommodating space 110 may be provided with an installation space 112, and the elastic piece 400 may be located in the installation space 112. During installation, the first end of the elastic piece 400 can abut or be fastened at the bottom of the installation space 112, the rolling body 300 can be movably disposed in the installation space 112, and the installation space 112 has a second opening 113. At least part of the rolling body 300 can extend out of the accommodating space 110 through the second opening 113, and be in rotational contact with the functional unit 200, so as to generate the elastic force on the functional unit 200, thereby preventing the functional unit 200 from being stuck.

In this case, the installation space 112 can provide installation positions for the elastic piece 400 and the rolling body 300, so that the elastic piece 400 and a part of the rolling body 300 can be hidden in the installation space 112, thereby preventing the foregoing components from extending too much affecting the extending and retracting of the functional unit 200. In addition, the installation space 112 can further play a guiding role, so that the elastic force generated by the elastic piece 400 may be in a direction along an axial direction of the installation space 112. This can better prevent the functional unit 200 from slanting.

To improve installation reliability of the rolling body 300, an edge of the second opening 113 may be provided with a limiting protrusion 114, and the limiting protrusion 114 may be in limiting fit with the rolling body 300. In this case, the limiting protrusion 114 can limit part of the rolling body 300 in the installation space 112, thereby improving installation stability of the rolling body 300 to prevent the rolling body 300 from falling into the accommodating space 110. In addition, this method makes it unnecessary to fasten the rolling body 300 and the elastic piece 400, thereby facilitating the installation. In addition, the limiting protrusion 114 can further prevent most protrusions of the rolling body 300 from affecting moving effect of the functional unit 200.

In addition, to make the rolling effect of the rolling body 300 better, in some implementations, the electronic device may further include a guide piece 500, and the second end of the elastic piece 400 may be connected to the rolling body 300 through the guide piece 500. Compared with the second end of the elastic piece 400 directly connected to the rolling body 300, this method makes the elastic piece 400 have better stability to generate the elastic force on the rolling body 300. In addition, this method can further make the elastic piece 400 have a smaller impact on the rolling effect of the rolling body 300, so that the rolling body 300 can roll better, thereby making movement stability of the functional unit 200 better.

In some implementations, the elastic piece 400 may be a spiral telescopic spring. The spiral telescopic spring has a compact structure and is easy to manufacture, so that it can perform extending and retracting better, and save costs. In addition, in a case that the elastic piece 400 is a spiral telescopic spring, the guide piece 500 may include a rod portion 510 and a limiting cap 520 that are connected. During installation, the rod portion 510 can extend into the spiral telescopic spring, the limiting cap 520 may be in limiting fit with an end portion of the spiral telescopic spring, and the limiting cap 520 may be in rotational contact with the rolling body 300. This method can improve assembly stability between the elastic piece 400 and the guide piece 500.

In some embodiments disclosed in this application, to improve movement stability of the functional unit 200, the functional unit 200 may be provided with a sliding groove 210 extending along a telescoping direction of the functional unit 200, and the rolling body 300 rotationally fits the sliding groove 210, that is, during movement of the functional unit 200, the rolling body 300 can roll on the sliding groove 210. In this case, the sliding groove 210 can play the role of limiting, so that the sliding groove 210 can rotationally fit the rolling body 300 to make movement stability of the functional unit 200 better. In addition, the sliding groove 210 further makes the rolling body 300 and the functional unit 200 in good rotational contact to better prevent the functional unit 200 from slanting in a direction other than the moving direction.

In some embodiments of this application, the side wall may include a first sub side wall 115 and a second sub side wall 116. The first sub side wall 115 and the second sub side wall 116 may be provided with a rolling body 300. In this case, two sides of the functional unit 200 are in rotational contact with the rolling body 300 during movement of the functional unit 200, so that movement stability of the functional unit 200 is better, and the functional unit 200 is better prevented from being slanting during movement, thereby improving movement stability of the functional unit 200.

Further, to make the telescopic effect of the functional unit 200 better, in some implementations, the rolling body 300 disposed on the first sub side wall 115 and the rolling body 300 disposed on the second sub side wall 116 may be disposed opposite each other in one-to-one correspondence, and may be both spaced apart along the moving direction of the functional unit 200. In this case, the two rolling bodies 300 disposed opposite can limit the functional unit 200 to a specific moving position, so as to improve moving stability of the functional unit 200 and prevent the functional unit 200 from being slanting during movement.

Correspondingly, in the foregoing case, the rolling body 300 may be connected to the first sub side wall 115 or the second sub side wall 116 through the elastic piece 400. In a working process, the functional unit 200 slants towards the first sub side wall 115 or the second sub side wall 116 in a telescopic process. When the functional unit 200 slants towards the first sub side wall 115, the rolling body 300 of the first sub side wall 115 can generate a first elastic force on the functional unit 200, and the first elastic force can push the functional unit 200 back to its original position, thereby preventing the functional unit 200 from slanting towards the first sub side wall 115. When the functional unit 200 slants towards the second sub side wall 116, the rolling body 300 of the second sub side wall 116 can generate a second elastic force on the functional unit 200, and the second elastic force can push the functional unit 200 back to its original position, thereby preventing the functional unit 200 from slanting towards the second sub side wall 116.

It can be learned that the foregoing method enables the functional unit 200 to be subjected to elastic forces in both the extending direction and the retracting direction, thereby preventing the functional unit 200 from being slanting when the functional unit 200 extends out of the accommodating space 110, and preventing the functional unit 200 from being slanting when the functional unit 200 retracts in the accommodating space 110, so that movement stability of the functional unit 200 is improved.

In some implementations, in the first sub side wall 115 and the second sub side wall 116, the rolling body 300 and the elastic piece 400 on one side of the first sub side wall 115 and the second sub side wall 116 form an elastic assembly, and two elastic assemblies disposed opposite each other can form a group of elastic apparatus. The electronic device disclosed in this embodiment of this application may include a plurality of groups of elastic apparatus. The plurality of groups of elastic apparatus may be spaced apart along a telescoping direction of the functional unit 200. In this case, the plurality of groups of elastic apparatus can generate elastic forces at a plurality of positions of the functional unit 200, so as to better prevent the functional unit 200 from slanting, thereby reducing friction between the functional unit 200 and the side wall of the accommodating space 110, and mitigating damages to the functional unit 200. In addition, this can prevent the functional unit 200 from being stuck during movement.

In some implementations, one side of the first sub side wall 115 and the second sub side wall 116 may be provided with a plurality of elastic assemblies. The elastic assembly is an integral part of the rolling body 300 and the elastic piece 400. In the telescoping direction of the functional unit 200, the plurality of elastic assemblies may be spaced apart on the first sub side wall 115 or the second sub side wall 116. The plurality of elastic assemblies can generate great elastic forces on the functional unit 200 in a certain direction, so as to better prevent the functional unit 200 from being slanting in the certain direction, thereby improving movement stability of the functional unit 200.

Further, in another installation process, the plurality of elastic assemblies may be located at a different side from the drive device. In this case, during a process in which the functional unit 200 extends out of the accommodating space 110, when a driving force exerted by the drive device on the functional unit 200 makes the functional unit 200 slant towards the elastic assembly, the elastic assembly can generate the elastic force on the functional unit 200 to prevent the functional unit 200 from slanting during the extending process. The plurality of elastic assemblies may also be installed on a same side with the drive device. In this case, during a process in which the functional unit 200 retracts to the accommodating space 110, when the driving force exerted by the drive device on the functional unit 200 makes the functional unit 200 slant towards the elastic assembly, the elastic assembly can generate the elastic force on the functional unit 200 to prevent the functional unit 200 from slanting during the retracting process.

In some implementations, the drive device may be a lead screw drive device. In some implementations, the functional unit 200 may include a unit body 220 and a unit bracket 230. The unit body 220 may be connected to the unit bracket 230. The drive device may include a drive portion 610 and a lead screw 620. The drive portion 610 may be a rotating motor. The drive portion 610 may be connected to the lead screw 620, and a power output shaft of the drive portion 610 may be directly connected to the lead screw 620. The drive portion 610 may also be connected to the lead screw 620 through a gear. This is not limited in this embodiment of this application.

Further, the unit bracket 230 is movably disposed on the lead screw 620, and the drive portion 610 can drive the lead screw 620 to rotate, thereby driving the unit body 220 to move, so that the unit body 220 can retract into the accommodating space 110 or at least partially extend out of the accommodating space 110 through the opening. Compared with the drive device of other structures, the lead screw drive device has the characteristics of high transmission efficiency and high positioning accuracy, which can make the functional unit 200 have better movement stability.

The electronic device in this embodiment of this application may be a device, such as a smart phone, a tablet computer, an e-book reader, a wearable device (for example, a smart phone), and a video game console. The embodiments of this application do not limit the specific type of the electronic device.

The foregoing embodiments of this application focus on the differences between the embodiments. As long as different features of improvement in the embodiments are not contradictory, they can be combined to form a more preferred embodiment. Further descriptions are omitted herein for the purpose of brevity.

The foregoing descriptions are only embodiments of this application, but this application is not limited to such embodiments. For a person skilled in the art, this application may have various changes and variations. Any modifications, equivalent substitutions, improvements, and the like made within the spirit and principle of this application should be included within the scope of the claims of this application.

The invention claimed is:

1. An electronic device, comprising:
a housing comprising an accommodating space and a first opening communicated with the accommodating space;
a functional unit movably disposed in the accommodating space;
a drive device disposed in the housing and connected with the functional unit, wherein the drive device is configured to drive the functional unit to retract into the accommodating space through the first opening, or at least partially extend out of the accommodating space;
a rolling body disposed on a side wall of the accommodating space, and during movement of the functional unit relative to the side wall of the accommodating space, the rolling body is in rotational contact with the functional unit, and an extending direction of the side wall is parallel to a moving direction of the functional unit;
an elastic piece; and
a guide piece between the elastic piece and the rolling body.

2. The electronic device according to claim 1, wherein a first end of the elastic piece is connected with the side wall, and a second end of the elastic piece is connected with the rolling body.

3. The electronic device according to claim 2, wherein the second end of the elastic piece is connected with the rolling body through the guide piece.

4. The electronic device according to claim 1, wherein the side wall is provided with an installation space, the elastic piece is in the installation space, the rolling body is movably disposed in the installation space, and the installation space has a second opening, wherein at least part of the rolling body extends to the accommodating space through the second opening, and is in rotational contact with the functional unit.

5. The electronic device according to claim 4, wherein an edge of the second opening is provided with a limiting protrusion, wherein the limiting protrusion is in limiting fit with the rolling body.

6. The electronic device according to claim 1, wherein the functional unit is provided with a sliding groove extending along a telescoping direction of the functional unit, and the rolling body rotationally fits the sliding groove.

7. The electronic device according to claim 1, wherein the side wall comprises a first sub sidewall and a second sub side wall that are opposite each other, wherein both the first sub side wall and the second sub side wall are provided with the rolling body.

8. The electronic device according to claim 7, wherein the rolling body disposed on the first sub side wall and the rolling body disposed on the second sub side wall are disposed opposite each other in one-to-one correspondence, and are both spaced apart along the moving direction of the functional unit.

9. The electronic device according to claim 1, wherein the functional unit comprises a unit body and a unit bracket, and the unit body is connected with the unit bracket, wherein the drive device comprises a drive portion and a lead screw, the drive portion is connected with the lead screw, the unit bracket is movably disposed on the lead screw, and the drive portion drives the lead screw to rotate, thereby driving the unit body to move.

10. The electronic device according to claim 1, wherein the functional unit comprises at least one of a camera assembly, a fit-in light unit, a fingerprint recognition unit, a universal serial bus interface, and a telephone receiver.

11. The electronic device according to claim 1, wherein the guide piece further comprises a rod portion and a limiting cap connected to the rod portion.

12. The electronic device according to claim 11, wherein the rod portion extends into the elastic piece, and the limiting cap fits with the second end of the elastic piece.

13. The electronic device according to claim 11, wherein the limiting cap is in rotational contact with the rolling body.

* * * * *